United States Patent [19]

Spence-Bate et al.

[11] 4,226,526
[45] Oct. 7, 1980

[54] TRANSPORT AND POSITIONING MECHANISM

[75] Inventors: Harry A. H. Spence-Bate, Morley, Australia; Timothy Bain-Smith, Charing, England

[73] Assignee: Harry Arthur Hele Spence-Bate, Morley, Australia

[21] Appl. No.: 44,316

[22] Filed: May 31, 1979

Related U.S. Application Data

[63] Continuation-in-part of Ser. No. 838,724, Oct. 3, 1977, Pat. No. 4,176,947.

[30] Foreign Application Priority Data

Oct. 4, 1976 [GB] United Kingdom ............... 41118/76
Jun. 30, 1978 [GB] United Kingdom ............... 25103/78

[51] Int. Cl.³ ...................... G03B 27/42; G03B 27/62
[52] U.S. Cl. .......................................... 355/53; 355/76
[58] Field of Search ................... 355/53, 72, 73-76

[56] References Cited

U.S. PATENT DOCUMENTS

| | | | |
|---|---|---|---|
| 2,236,197 | 3/1941 | Moore | 355/72 |
| 2,599,859 | 6/1952 | Ogg | 355/72 X |
| 2,799,205 | 7/1957 | Bacsik | 355/76 |
| 3,103,850 | 9/1963 | Khoury et al. | 355/76 |
| 3,704,945 | 12/1972 | Denis et al. | 355/72 X |

FOREIGN PATENT DOCUMENTS 595706  8/1959  Italy ........................................... 355/75

OTHER PUBLICATIONS

I.B.M. Technical Disclosure Bulletin vol. 4, No. 10, Mar. 1962, p. 8, R. Wilmer Document Transport.

*Primary Examiner*—Donald A. Griffin
*Attorney, Agent, or Firm*—Fidelman, Wolffe & Waldron

[57] ABSTRACT

Substrates such as printed circuit boards are transported between and precisely indexed at work stations by means of a gas cushion formed on a plate. The substrate is transported and shifted from position to position by means of ducted gas jets or sweeps while indexing of the substrate is achieved by means of movable stops controlled by electromagnets or pneumatic means. The system finds particular use in the drilling of printed circuit boards and for component insertion, especially of integrated circuit chips, thereon.

18 Claims, 12 Drawing Figures

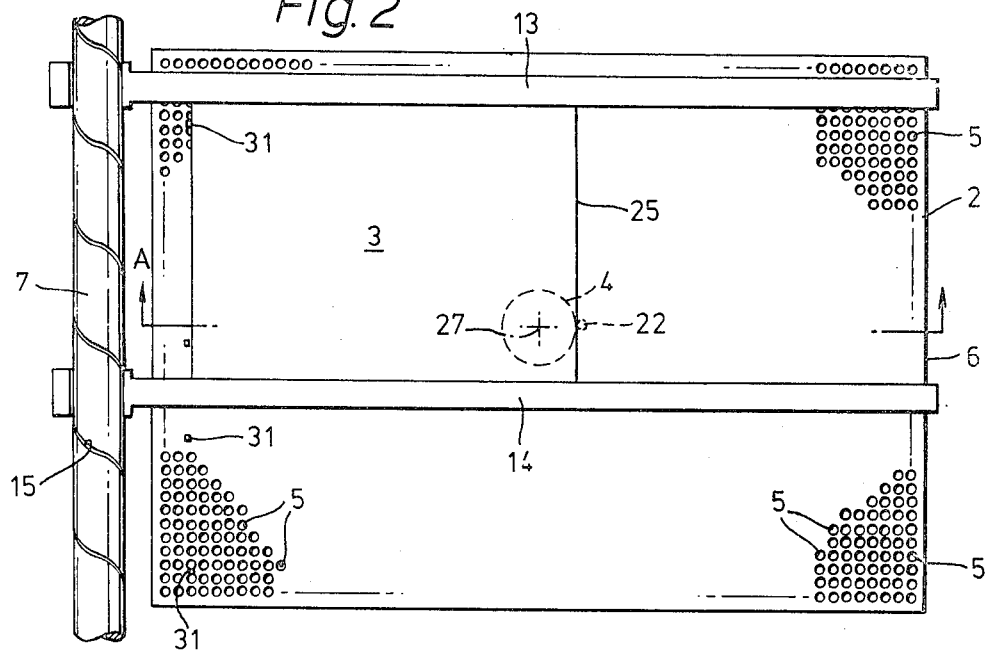
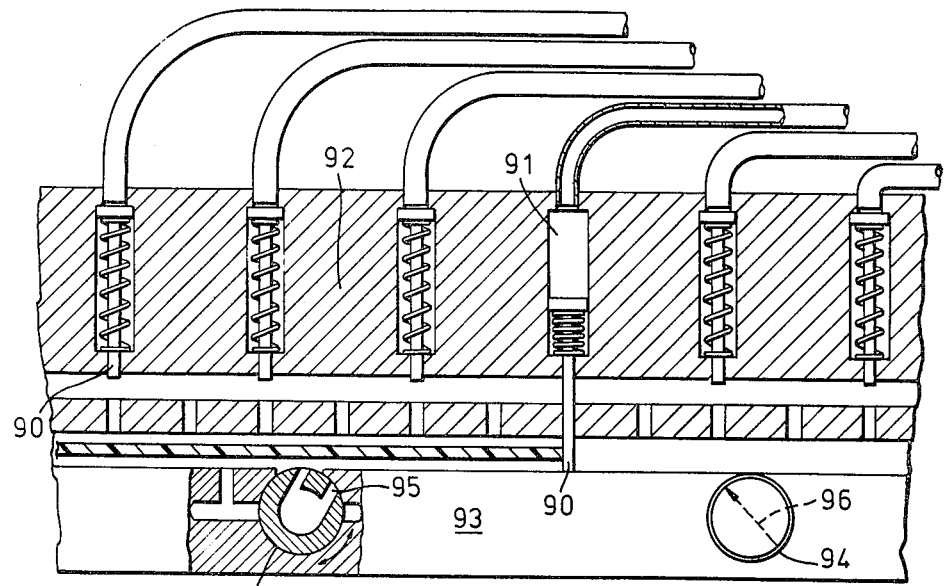

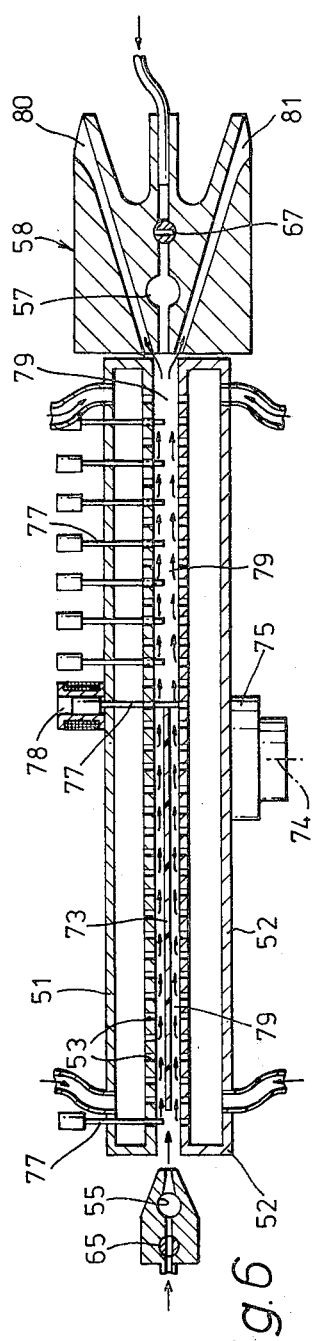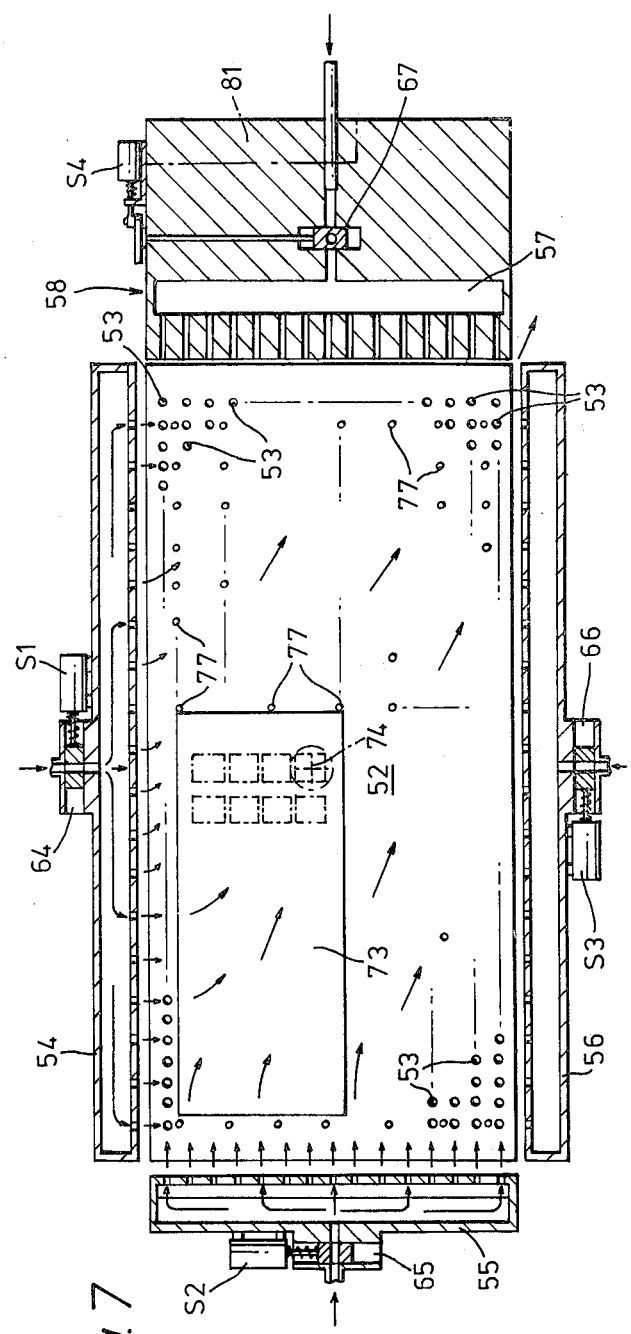
Fig.6
Fig.7

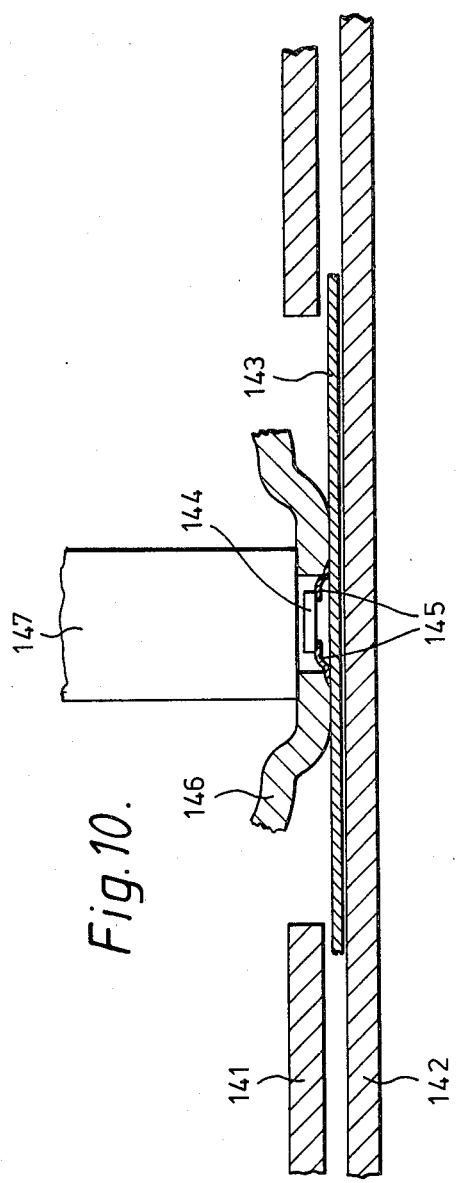
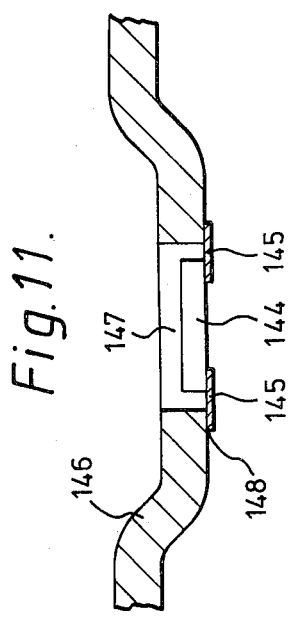

TRANSPORT AND POSITIONING MECHANISM

CROSS REFERENCES TO RELATED APPLICATIONS

This application is a continuation-in-part of copending application Ser. No. 838,724 filed Oct. 3, 1977 for "STEP AND REPEAT MECHANISM" now U.S. Pat. No. 4,176,947 issued Dec. 4, 1979.

BACKGROUND OF THE INVENTION

This invention relates generally to transporting and positioning devices.

More particularly, this invention relates to devices for transporting substrates, especially printed circuit boards, to and between precisely indexed locations or work stations and performing work such as component attachment thereon.

Substrates such as printed circuit boards are conventionally conveyed to and between work stations by mechanical means such as conveyor belts and the like. Once delivered to a work station, the substrate is adjusted to or moved between precisely indexed positions for operations such as drilling and component insertion or attachment by mounting the substrate on an X-Y pantograph device. Such a pantograph device typically is moved by helical drive actuators in an X and Y direction controlled either manually or by means of a computer controlled servo system such as that disclosed in U.S. Pat. No. 3,739,158.

It is also known to transport sheet material such as strips of photographic film to and from a document sensing station by means of a pneumatic transport chute in which the film is supported on an air cushion. Such a system is described in U.S. Pat. No. 3,103,850.

SUMMARY OF THE INVENTION

A work station is provided in association with a plate on which a gas cushion is maintained. A circuit board is transported about the plate surface by ducted gas jets or sweeps and is precisely located or indexed relative to the work station by means of movable stops which may be pneumatically or electromagnetically controlled. Work such as drilling or component insertion is then performed on the board and the board is thereafter shifted to a new position relative to the same station or is transported on the gas cushion to another work station.

Hence, it is an object of our invention to provide transporting and indexing means to locate a circuit board relative to a work station.

Another object of our invention is to provide air cushion transport means between work stations in printed circuit systems manufacture.

One specific object of our invention is to transport circuit boards to and from a work station, to precisely index the boards at that station for component insertion and the like.

BRIEF DESCRIPTION OF THE DRAWINGS

FIG. 2 is a plan view of a lower gas cushion plate for the embodiment of FIG. 1.

FIG. 6 shows a side view of a second embodiment of the invention.

FIG. 7 is a plan view of a lower gas cushion plate for the embodiment of FIG. 6.

FIG. 8 is a sectional view of a third embodiment.

FIG. 10 illustrates another component attachment device using beam-lead bonding techniques.

FIG. 11 illustrates an integrated circuit chip loaded into a tape carrier.

DESCRIPTION OF THE INVENTION

Figure 1:
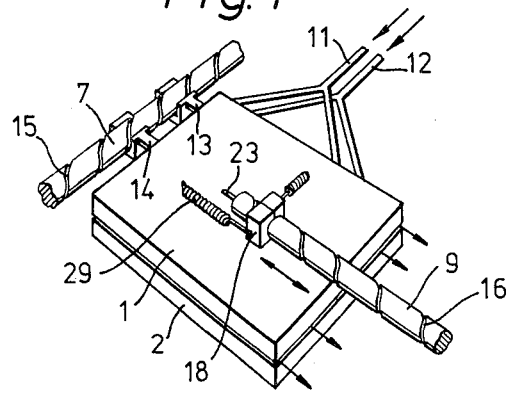
FIG. 1 is a perspective view of one embodiment according to the invention.
Figure 3:
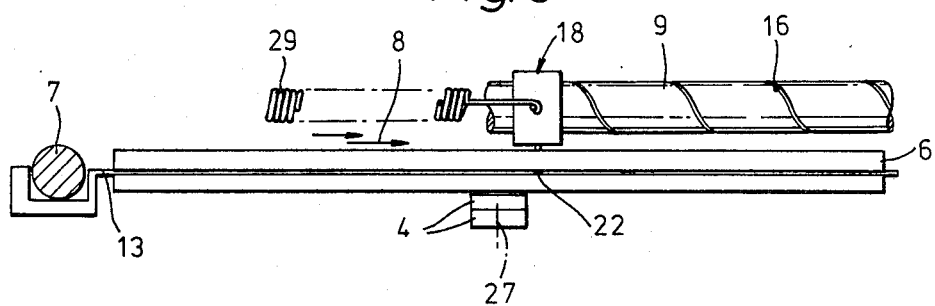
FIG. 3 is a side view of both gas cushion plates as seen from AA in FIG. 2.
Figure 4:
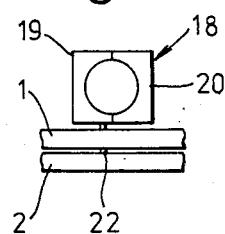
FIG. 4 shows part of the X shift and return arrangement for the embodiment shown in FIG. 1.

In FIG. 1 there is shown upper and lower gas cushion plates 1 and 2 between which a printed circuit board 3 (see FIG. 2) is supported on a gas cushion. Above the upper gas cushion plate a drilling device 101 which will be described later is provided. Below the lower gas cushion plate a swarf removal device 4 is located (see FIG. 3) in drill axis 27. The board 3 is supported by means of an upper and lower cushion fed from jets 5 (see FIG. 2) which are inclined to the vertical towards the edge 6 remote from a Y shift helically grooved drum 7. The inclination of the jets 5 sets upper and lower cushions between the microfiche and upper and lower plates, moving in the direction 8 as shown in FIG. 3, towards the edge 6. The jets are supplied with gas (suitably air) pressure by means of ducts 11 and 12.

The purpose of the present arrangement is to provide a step and repeat mechanism in a printed circuit board drilling machine, and in order to control the stepping of the board 3 from one hole position to another two helically grooved drums 7 and 9 are used for Y and X shift respectively. Driven by the helix on the drum 7 are two means for moving the board comprising sweep members 13 and 14 which are positioned apart so as to abut on two sides of the board 3. The helix 15 on the drum 7 serves to drive the two sweep members 13 and 14 to any one of a number of predetermined Y positions for shifting the board relative to the drill axis 27.

In order to shift the board 3 in an X direction, a groove 16 on drum 9 drives a groove follower 17 mounted on a drive block 18 which splits into two parts 19 and 20, the purpose of which will presently be described. The part 19 of the drive block in turn is attached to a probe 22 which passes through a slot 23 in the upper plate 1 and acts as a stop for the edge 25 of the board 3 remote from the helically grooved drum 7 along an X axis, passing through drill axis 27. X axis shift of the board 3 is achieved by shifting the probe 22 in the X direction, and by constantly moving the board into engagement with it by means of the inclined jets 5.

Figure 5:
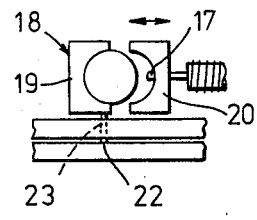
FIG. 5 shows the arrangement of FIG. 4 in a release position.

In order to return the board 3 in an X direction back towards drum 7 after the board has reached its extreme X direction position nearest to the edge 6 of the plate 2, the drive block 18 is split, as shown in FIG. 5, so as to release the groove follower 17 from the groove 16 whereupon a spring 29 acts on part 19 of the drive block 18 which flicks the probe 22 back towards the end of its groove 29 to return the board 3 back towards the drum 7. A new row of drill holes on the board 3 is then selected by shifting the sweep members 13 and 14 in a Y direction. Stops 31 adjacent the drum 7 are provided on the lower plate 2 to stop the board 3 from moving out of the plates. Suitable grooves (not shown) are provided in sweep members 13 and 14 so as to pass over the stops 31.

Figure 5A:
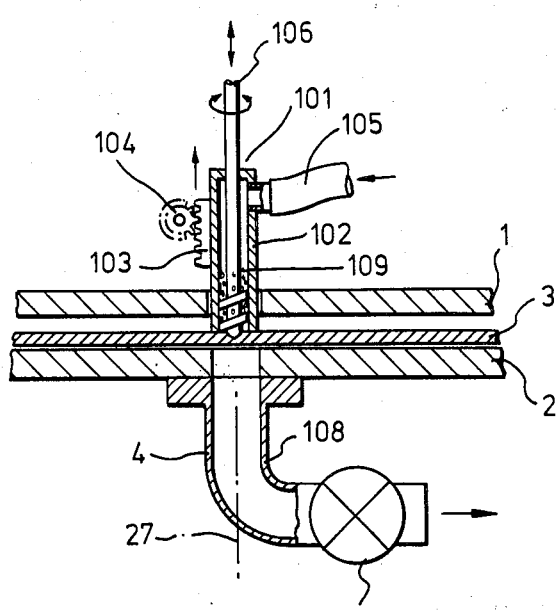
FIG. 5A shows a drilling device for the first embodiment.

The drilling device 101 is shown in FIG. 5A positioned above the upper plate 1 and the swarf removal device is shown below the lower plate 2. When the board 3 is positioned relative to the drill axis 27 a member 102 is lowered by means of rack 103 and pinion 104 so that the board 3 is firmly held to the bottom plate 2, gas pressure is then applied to the interior of member 102 via duct 105 and drill bit 106 is then lowered onto board 3 and rotated to drill a hole in board 3. Simultaneously via valve 107 is opened and a vacuum is applied to duct 108. As the drill passes through the board, swarf 109 collecting above the tip of the drill bit is blown and sucked into duct 108 and is removed from between the plates 1 and 2. The drill bit is then raised and the member 102 is also raised for the next drilling operation. Alternatively, a focussed laser may be substituted for the mechanical drill. In this embodiment, the laser is mounted along process axis 27 and, upon indexing the circuit board relative to the process axis, the laser is discharged to burn a hole through the board.

Another embodiment is now described with reference to FIGS. 6 and 7. This has a similar drilling device to that shown in FIG. 5A.

In FIG. 6 upper and lower cushion plates 51 and 52 are provided. Each plate has vertical gas cushion jets 53 and side horizontal jet manifolds 54, 55, 56 and 57. Jet manifold 57 is mounted in a broad inlet and outlet feed device 58. Movement in the X axis is achieved by opening valve 65 or 67 in supply ducts to manifolds 55 and 57 respectively and movement in the Y axis is achieved by opening valves 64 and 66 respectively so that horizontal jets of gas deflect the vertical cushions formed by jets 53.

Location of the board 73 with respect to the drill axis 74 is achieved by vertical movement of probes 77 activated by solenoids 78 (only one being shown for clarity). The probes 77 are shifted into or out of the space 79 between the plates 51 and 52.

The activation of the solenoids 78 is preferably carried out using an electronically controlled programming control mechanism, but for the sake of simplicity a simple electrical control system could be used using a series of drums formed as rotary switches, each drum having contacts for activation probes aligned in the Y axis and locating the board in the Y axis. At the end of one revolution a succeeding drum is brought into operation and a new row of probes in the X axis are pushed into the space 79 between the plates and the previous row removed. The jet manifold 54 deflects the board 73 onto the new set of probes. Return of the board to the start of the new row is achieved by the drum having a contact opening manifold valve 67 and closing valve 65.

In order to insert boards into the space 79 between the plates 51 and 52 the device 58 is moved downwards so that a sloping inlet passage 80 is aligned with space 79, a board being dropped down the passage into the cushion. For removal of boards the device 58 is moved upwards so that a sloping outlet passage 81 is aligned with space 79 and by operation of manifold 55 boards can be blown out of the space 79 down passage 81 to remove them from the drilling device or for transfer to a further station.

In FIG. 8 a largely pneumatic arrangement is shown where stops 90 are activated by pneumatic cylinders 91 in a top plate 92. The action is similar to that shown in FIGS. 6 and 7. In the bottom plate, however, semi rotary gas jet activators 94 are provided which can be partially rotated so that gas jets 95 can face either toward one side of the plates 92 and 93 as shown in firm lines in the drawing or toward an opposite side of the plates as indicated by broken line 96.

This same semi rotary gas jet activation can be used in the arrangement shown in FIGS. 6 and 7.

In a further arrangement (not shown) the semi rotary gas jet activators can be used without stops. The location in predetermined X and Y positions is achieved by positioning a plurality of sensors, preferably dielectric sensors, between the plates which on sensing the predetermined X and Y position cause a signal to be transmitted to a solenoid valve which shuts off cushion gas supply on one side of the board. The board is then caused to engage with one plate or the other to retain the board in the sensed location. The supply to the semi rotary gas jet activators is cut off in one arrangement and in another arrangement the activators are rotated so the jets face perpendicular to the plane of the plates and the jets assist in holding the board to the opposed plate.

It will be appreciated that although in the embodiments shown, opposed upper and lower plates are provided but only a lower plate may suffice.

Instead of using the step and repeat mechanism for drilling it is also possible to adapt this for component insertion. A component insertion device using a simple mechanical pantograph mechanism is shown in U.S. Pat. No. 3,727,284 and the object is to replace the mechanical pantograph by the gas cushion pantograph step and repeat mechanism of the invention.

Figure 9:
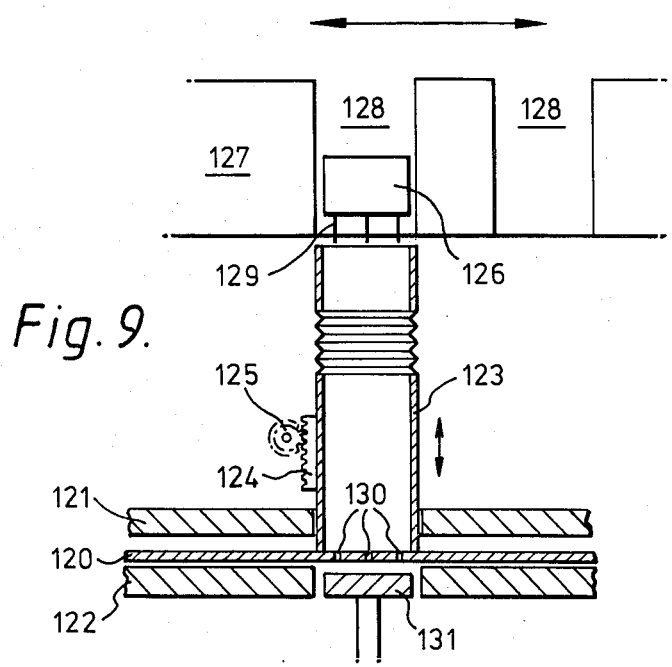
FIG. 9 shows a component insertion device for the above embodiments.

A schematic insertion device is shown in FIG. 9. In the device a board 120 ready drilled to take components is moved as to predetermined X/Y locations by mechanisms similar to those shown in FIGS. 1 to 8 between upper and lower gas cushion plates 121 and 122. In a similar way to the drilling device a member 123 is lowered by rack 124 and pinion 125 or any other suitable raising and lowering mechanism such as a solenoid or pneumatic device. This member 123 clamps the board 120 to the lower plate and a component 126 is then fed from one of several magazines 128 in a shifting magazine block 127 through the member 123 so that leads 129 of the component 126 enter holes 130 in the board 120. Below the board 120 a clinching block 131 operates to clinch the leads to secure the component in the board.

Control of X and Y positioning may be by any suitable digital control system such as that shown in U.S. Pat. No. 3,739,158.

FIGS. 10 and 11 illustrate another embodiment of the invention in which single and multichip integrated circuit packages are mounted on a board by a compliant beam-lead bonding technique. Board 143, which in this embodiment preferably comprises a metallized ceramic, is supported between upper and lower gas cushion plates 141 and 142 at a work station.

At the work station, a chip 144 comprising an integrated circuit package and having a plurality of leads 145 is mounted on board 143. Chip 144 is carried on compliant member 146 which preferably comprises a metallic tape prepunched for chip insertion. Bonding is accomplished by pressure applied by heated ram 147. Pressure and heat transmitted by ram 147 is applied only to leads 145, through compliant member 146, causing the compliant member to plastically deform about the beam lead-circuit board contact area during the formation of a solid state bond between the leads and the board. At no time does the ram touch or contact chip 144 thus avoiding the possibility of chip damage through either heat or pressure.

FIG. 11 is a longitudinal section through the compliant tape illustrating its appearance prior to bonding. Chip 144 is loaded into and centered within a window 147 formed at spaced intervals along compliant tape 146. The chip is held in place within the window by means of an adhesive flux such as a resin bonding beam leads 145 to member 146 at junction areas 148. The compliant tape preferably has an embossed configuration as shown and spaced dimples (not shown) along the edges thereof to maintain sufficient clearance between adjacent coils of wound tape to protect the chips during loading, handling, and bonding operations.

The compliant tape itself is conventionally manufactured of aluminum or copper alloys having appropriate flow stress properties at the bonding temperature. Temperature of heated ram 147 is typically maintained on the order of 500° C. Dwell time of the ram on the compliant tape is limited to that required to form a solid-state weld or bond between the beam leads and the circuit board and typically is on the order of one to two seconds.

In the production of printed circuit boards numerous operations are required where X and Y positioning may be carried out at different work stations and the mechanism described is suitable for such purposes. Between stations it is necessary to move the boards solely in an X or Y direction and the mechanism is particularly adapted for such purposes.

It will also be appreciated that the mechanism as described in parent patent application Ser. No. 838,724 is particularly useful for photographically recording images of circuit diagrams for photo sensitive resist printing and particularly a microfiche can contain a series of circuit diagrams for subsequent assembly in multi layer circuits, each layer being recorded in a separate image position. In this way one fiche can contain all the circuitry required for a complex multi layer circuit diagram.

Furthermore, the X and Y shift device can be used for fast track running and routing where track running is conveniently automated by computer control. Track running being a suitable process for high speed automated control.

It has been noted during research that in order to direct a lamina in a particular X or Y direction, that directional guidance by air jets may be replaced by providing an opening at the sides of the plates in the direction towards which the lamina is to be moved.

We claim:

1. A circuit board processing mechanism comprising two opposed plates, means for maintaining a cushion of gas on one of said plates to support a circuit board in a plurality of X and Y positions relative to a process axis intersecting said plates, said means comprising ducts formed in at least one plate and arranged to direct a flow of gas for said cushion towards a space between the plates into which a said board is insertable, means for performing work on said board, said means located at the process axis, and means for moving the board across the plate to any of the plurality of X and Y positions.

2. A mechanism as claimed in claim 1 wherein said plate or at least one said plate is provided with further ducts arranged to direct a flow of gas towards one side of the or each plate.

3. A mechanism as claimed in claim 1 wherein said ducts are arranged to direct a flow of gas towards one side of the or each plate.

4. A mechanism as claimed in claim 1 wherein stops are provided movable into the space between the plates.

5. A mechanism as claimed in claim 4 wherein the stops are controlled by electromagnets activated by programming means enabling selection of at least one or a series of said electromagnets to move one or more stops into microfiche frames locating positions.

6. A mechanism as claimed in claim 1 wherein one or more sweep members are provided movable between the plates to locate an edge of a board in a required position between the plates.

7. A mechanism as claimed in claim 6 wherein the or each sweep member is moved by means of a helically grooved drum.

8. A mechanism as claimed in claim 7 wherein the or each sweep member is disengageable from the drum and is returned by a reset means to a board starting position.

9. A mechanism as claimed in claim 1 wherein a board feed device is provided adjacent one edge of the plates, said device comprising a board inlet chute and an outlet chute, the device being movable in a direction perpendicular to the planes of the plates so as to align the inlet or outlet chutes with the space between the plates.

10. A mechanism as claimed in claim 9 wherein the device is further provided with a gas inlet and outlets directable towards the space between the plates.

11. A mechanism as claimed in claim 10 wherein gas outlets are directable towards the space between the plates from a side of the plates opposite said device.

12. A mechanism as claimed in claim 10 where gas outlets are directable towards the space between the plates from a side adjacent the side of the plates at which said device is positioned.

13. A mechanism as claimed in claim 1 comprising sensors provided between the plates, X and Y position selection means, said sensors cooperating with the selection means to cause a circuit board between the plates to be biased onto one said plate at a selected position.

14. A mechanism as claimed in claim 1 wherein a drill bit is positioned in the process axis so as to drill through a board on the plate or between the plates.

15. A mechanism as claimed in claim 14 wherein a hollow member is movable around the bit so as to clamp the board to the plate, gas being arranged to be passed between the bit and member to drive swarf from a hole drilled in the board.

16. A mechanism as claimed in claim 1 wherein a hollow member is movable on the board so as to clamp the board to the plate, components for fixing to the board being insertable from a magazine through the hollow member.

17. A mechanism as claimed in claim 1 wherein a laser beam is used to drill holes in the board at the process axis.

18. A mechanism as claimed in claim 1 wherein said means for performing work comprises a compliant beam-lead bonding device.

* * * * *